(12) United States Patent
Chang

(10) Patent No.: US 7,655,540 B2
(45) Date of Patent: Feb. 2, 2010

(54) METHOD AND JIG STRUCTURE FOR POSITIONING BARE DICE

(75) Inventor: Cho-Hsin Chang, Fenyuan Township, Changhua County (TW)

(73) Assignee: Universal Scientific Industrial Co., Ltd., Nan-Tou (TW)

( * ) Notice: Subject to any disclaimer, the term of this patent is extended or adjusted under 35 U.S.C. 154(b) by 0 days.

(21) Appl. No.: 12/076,674

(22) Filed: Mar. 21, 2008

(65) Prior Publication Data

US 2009/0239317 A1 Sep. 24, 2009

(51) Int. Cl.
*H01L 21/46* (2006.01)
*H01L 21/78* (2006.01)
*H01L 21/301* (2006.01)

(52) U.S. Cl. .................. 438/462; 438/106; 438/64; 257/E21.238; 257/E21.329; 257/E21.499; 257/E21.517

(58) Field of Classification Search .................. 438/462, 438/463, 460, 113, 118, 106, 64, 70
See application file for complete search history.

(56) References Cited

U.S. PATENT DOCUMENTS

| 6,453,096 B1 * | 9/2002 | Kim et al. ...................... 385/52 |
| 7,407,863 B2 * | 8/2008 | Hsieh et al. .................. 438/406 |

\* cited by examiner

*Primary Examiner*—David Nhu
(74) *Attorney, Agent, or Firm*—Kile Goekjian Reed & McManus PLLC

(57) ABSTRACT

A method and jig structure for positioning bare dice is disclosed. The jig structure for positioning at least one bare dice includes a trap having at least one positioning groove wherein the depth of the positioning groove is less than the height of the bare dice. Basing on the positioning groove formed in the tray, once a bare dice is placed in the positioning groove, the partially exposed bare dice can be located directly and precisely vacuum-grabbed by a sucker, so that the number of positioning steps is reduced.

7 Claims, 4 Drawing Sheets

METHOD AND JIG STRUCTURE FOR POSITIONING BARE DICE

BACKGROUND OF THE INVENTION

1. Field of the Invention

The present invention relates to a method and jig structure for positioning bare dice, especially to a method and jig structure for placing and positioning bare dice to expediate the bare dice manufacturing process.

2. Description of Related Art

During encapsulation processes in electronics industry, bare dice are generally vacuum-grabbed and moved onto circuit boards via suckers for the following treatment.

Please refer to FIG. 1 and FIG. 2 in turn, which illustrate a conventional method for positioning bare dice. In the conventional method 1, first provide a tray 1a with a plurality of positioning grooves 11a which are arranged in an array form (FIG. 1 and FIG. 2 only illustrate a single positioning groove, but it is easy to imagine a 2×2, 4×4, or 9×9 array. The number of array shown is for illustrative purpose only).

Then place a bare dice 2a in the positioning groove 11a, wherein the depth of the positioning groove 11a is greater than the height of the bare dice 2a.

Further, use a sucker 3a to grab bare dice 2a and move it onto a charge coupled device (CCD) 4a, and determine bare dice 2a's center position via image recognition for accurate location.

Having bare dice 2a's center position located, sucker 3a can move bare dice 2a to a predetermined position on a circuit board 6a (as shown in FIG. 4) for bonding operation.

Please refer to FIG. 1 and FIG. 3 illustrating conventional method 2 for positioning bare dice. Similar to conventional method 1, the present method 2 also starts by providing tray 1a with positioning grooves 11.

Then bare dice 2a is placed in positioning groove 11a, wherein the depth of the positioning groove 11a is greater than the height of the bare dice 2a.

Next, use the sucker 3a to grab bare dice 2a and move it onto an equipment platform which includes a positioning wall 51a and a push rod 52a. A positioning wall's corner 511a defines a positioning point for equipment platform.

The push rod 52a pushes bare dice 2a to abut against the positioning point 511a to attain the position defined by the positioning point and equipment platform.

Accordingly, bare dice 2a can be located at this defined position and can be drawn upwards for transfer to a predetermined position on circuit board 6a (as shown in FIG. 4) via sucker 3a for bonding operation.

However, misaligned bare dice stack appears in conventional methods. Bare dice with a complex geometric shape may not be properly recognized and located by charge coupled device 4a and the push rod 52a cannot evenly push the bare dice with complicated shape to abut against equipment platform's positioning point 511a correctly. So the two described above methods cannot be applied for positioning this kind of bare dice.

Furthermore, conventional methods for positioning bare dice have the shortcomings as follows:

1. Conventional positioning methods have too many steps which prolong working cycle, and positioning devices, such as image reorganization and locating hardware, are expensive and inconvenient to maintain;

2. Conventional positioning methods can only be used for positioning bare dice with simple shapes and cannot position bare dice with complex shapes, which reduces the versatility and flexibility of positioning devices.

Clearly, there is a need to provide a method for positioning bare dice which can effectively simplify positioning process to shorten work cycle and can be suitable for both simple shaped bare dice and complex shaped bare dice.

Hence, the inventors of the present invention believe that the shortcomings described above can and should be improved and finally suggest the present invention which is of a reasonable design and is an effective improvement.

SUMMARY OF THE INVENTION

An object of the present invention is to provide a method for bare dice positioning which can reduce the number of positioning steps and thereby simplify positioning process, shorten work cycle and improve production efficiency.

Another object of the present invention is to provide a jig structure for positioning bare dice. Especially bare dice with complex shapes so that they may be located accurately to be vacuum-grabbed via a sucker for the follow-up bonding operation.

To achieve the above-mentioned objects, a method for positioning bare dice in accordance with the present invention is provided. The method includes the steps of: step 1: providing a bare dice; step 2: providing a tray with at least one positioning groove; step 3: Arrange the bare dice in the positioning groove, wherein the depth of the positioning groove is less than the height of the bare dice; and step 4: providing a sucker to directly vacuum-grab the partially exposed bare dice and move the bare dice to a predetermined position onto a circuit board.

The present invention further provides a jig structure for positioning at least one bare dice. The jig structure includes a trap having at least one positioning groove wherein the depth of the positioning groove is less than the height of the bare dice.

The efficacy of the present invention is as follows:

Basing on the positioning groove formed in the tray, once a bare dice is placed in the positioning groove, the partially exposed bare dice can be located directly and precisely vacuum-grabbed by a sucker, so that the number of positioning steps are reduced;

The present invention does not require multiple corresponding complicated positioning devices, the tray itself has a simple structure with no electronic components and is of low cost, which can effectively reduce the cost of the present invention; and When the bare dice is located in the positioning groove, since the depth of the positioning groove is less than the height of the bare dice, a portion of the bare dice is located in the positioning groove and the rest of the portion, which has a complex geometric shape, is exposed outside the positioning groove. So the present invention is suitable for both simple shaped bare dice and complex shaped bare dice.

To further understand methods, means and efficacy of the present invention, please refer to the above summary and the following detailed description and drawings related the present invention. However, the attached drawings and corresponding description is for illustrative purpose only and is not meant to limit the scope of the invention.

DETAILED DESCRIPTION OF THE PREFERRED EMBODIMENTS

Please refer to FIGS. 5-8 illustrating a method and jig structure for positioning bare dice in accordance with the present invention. The jig structure is used for placement and locating of bare dice 1. A stack piece 2 is stacked on the upper face of bare dice 1. The jig structure has a tray 3.

Figure 1:
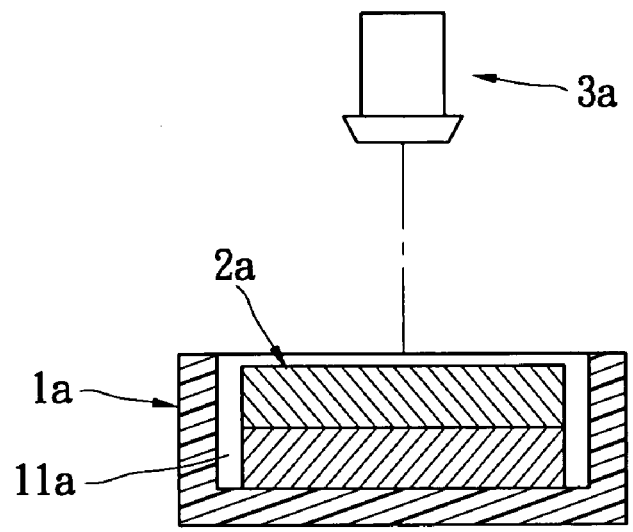
FIG. 1 is a schematic view of a conventional jig structure for positioning bare dice.
Figure 2:
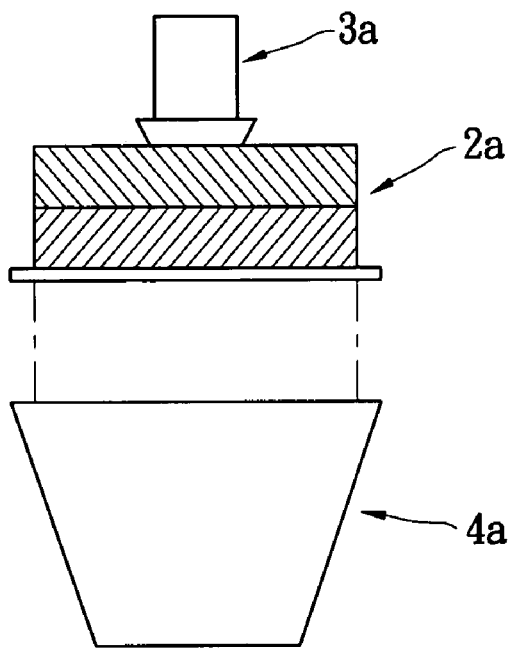
FIG. 2 is a schematic view showing bare dice locating via image recognition in conventional positioning method 1.
Figure 3:
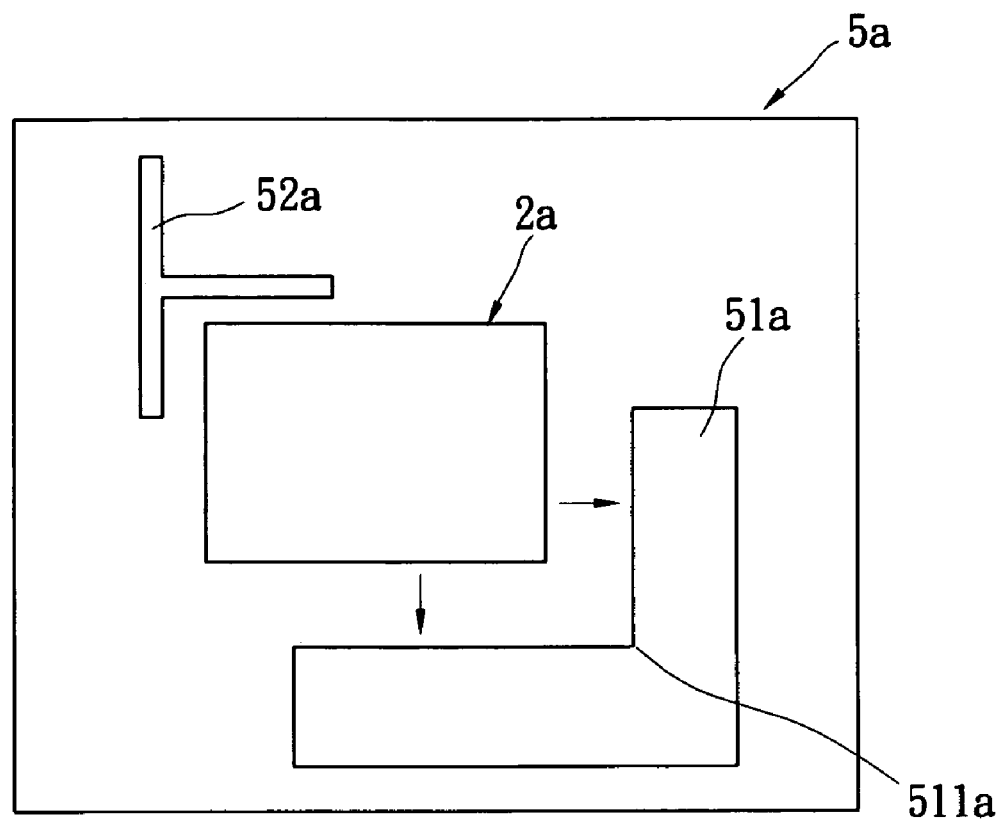
FIG. 3 is a schematic view showing bare dice positioning via a push rod and a positioning wall in conventional positioning method 2.
Figure 4:
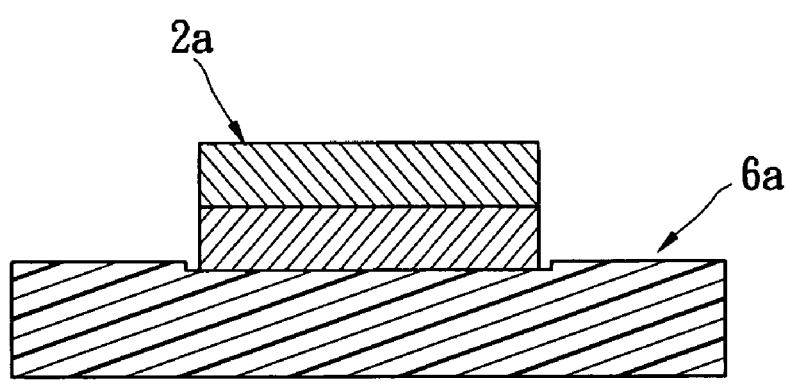
FIG. 4 is a schematic view showing the located bare dice is placed on a circuit board in the conventional positioning methods.
Figure 5:
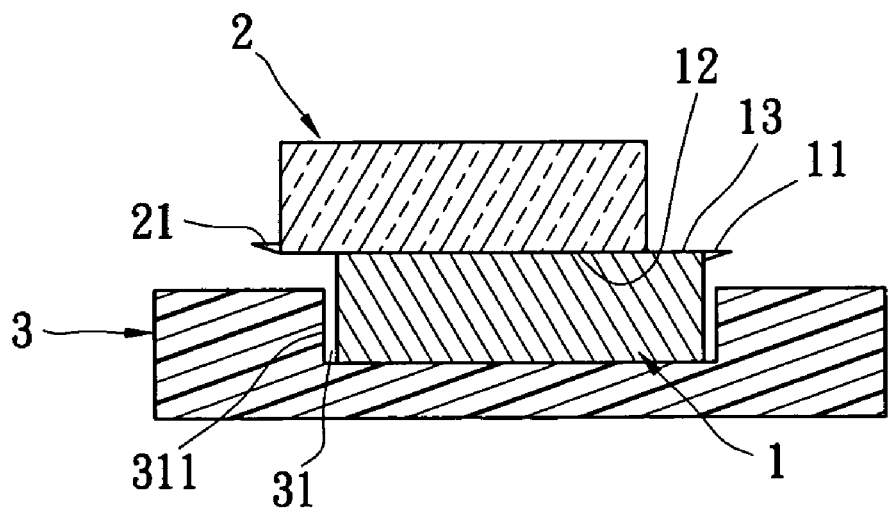
FIG. 5 is a schematic view showing a bare dice is placed in a positioning groove of a tray according to the present invention.

Please refer to FIG. 5, bare dice 1 has a rough edge 11 formed on the upper edge of a lateral face thereof. The rough edge 11 is formed during cutting and breaking of a wafer and may be removed via machining.

The stack piece 2 is an insulator, such as a color filter through which light may sufficiently pass. The stack piece 2 is misalignedly placed on the upper face of bare dice 1 via stacking. The stack piece 2 may be fixed on bare dice 1 via adhesion.

Right side of the stack piece 2 and the corresponding right side of the bare dice 1 are not even. The upper face 12 of the bare dice 1 adjacent to the side of the stack piece 2 is partially exposed and the exposed portion is a wire bond area 13 for the bare dice 1, which may be connected with electric wires.

The left side of stack piece 2 and the corresponding left side of bare dice 1 are not even, and the left side of the stack piece 2 extends out of the left side of bare dice 1 on the upper face of bare dice 1. The stack piece 2 has a rough edge 21 formed on the lower edge of its lateral face. The rough edge 21 of stack piece 2 is formed during cutting and breaking and may be removed via machining.

The tray 3 has a tray-shaped structure, and a plurality of positioning grooves 31 are arranged in an array form in tray 3 (herein, a single positioning groove is shown as illustrative example, the array may be expanded from 1×1 to 2×2, 4×4, or more as per requirement). The positioning groove 31 is concavely formed in the upper face of tray 3. The bare dice 1 and stack piece 2 are adhesively fixed together and placed in the positioning groove 31 together.

The positioning groove 31 is square-shaped. When bare dice 1 is placed in positioning groove 31, since the height of inner wall 311 of positioning groove 31 is less than the height of bare dice 1, the rough edge 11 on the upper edge of bare dice 1 and stack piece 2 are located outside positioning groove 31. The inner wall 311 of positioning groove 31 is close to the lateral face of bare dice 1. The length and the width of inner wall 311 are respectively 0.5 mm~1 mm greater than those of bare dice 1.

Figure 8:
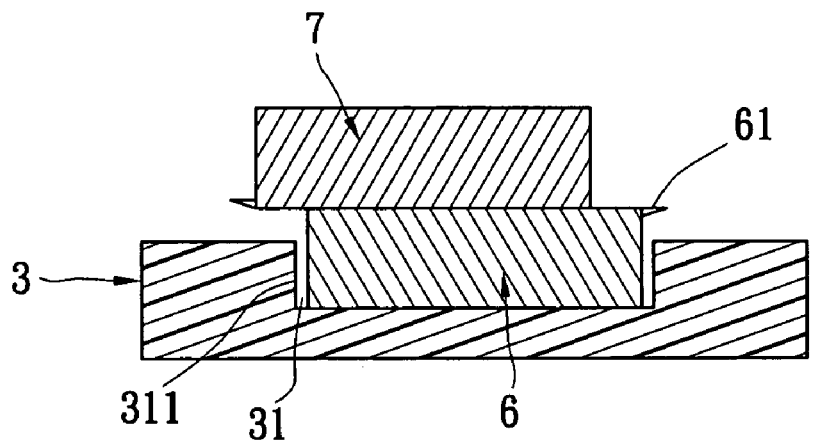
FIG. 8 is a schematic view showing a second bare dice placed on an upper face of a first bare dice.

Please refer to FIG. 8, the bare dice may be regarded as a first bare dice 6 and the stack piece may be regarded as a second bare dice 7. The second bare dice 7 is misalignedly placed on the upper face of first bare dice 6, as described above; the upper edge of first bare dice 6 has a rough edge 61 which is formed during cutting and breaking of a wafer.

Figure 6:
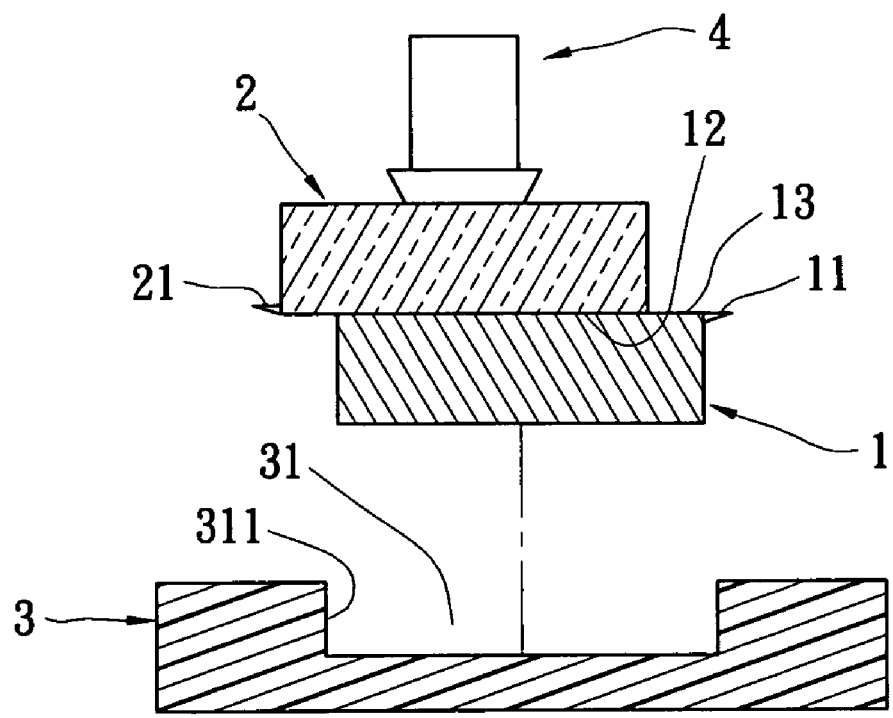
FIG. 6 is a schematic view showing a sucker vacuum-grabbed the bare dice in the positioning groove to draw it out according to the present invention (stack piece 2 may be fixed on the bare dice 1 via adhesion)
Figure 7:
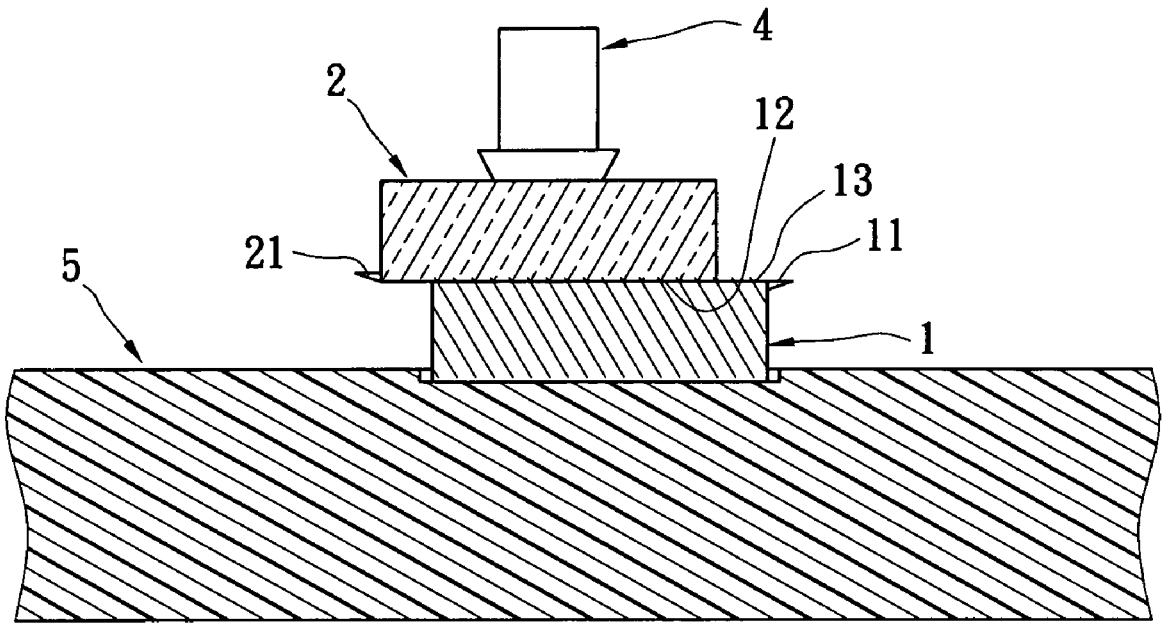
FIG. 7 is a schematic view showing the moved to a predetermined corresponding position on a circuit board via the sucker.

Please refer to FIG. 5, FIG. 6 and FIG. 7 in turn, the method for positioning bare dice via the above jig structure includes the steps of: firstly providing at least one bare dice 1, providing the above tray 3 with positioning groove 31, and then accurately positioning bare dice 1 and stack piece 2 in positioning groove 31 of tray 3, wherein the depth of positioning groove 31 is less than the height of bare dice 1 and the distance between inner wall 311 of positioning groove 31 and the lateral face of bare dice 1 is 0.5 mm-1 mm, whereby bare dice 1 is located.

At this time, a sucker 4 over tray 3 may directly and precisely vacuum-grab the upper face of stack 2 so that stack 2 which is adhesively fixed to bare dice 1 may be drawn out together from positioning groove 31 and moved to a predetermined position on a circuit board 5 for the follow-up bonding operation.

The efficacy and features of the present invention are as follows:

1. Basing on the positioning groove 31 formed in the tray 3, once bare dice 1 is placed in positioning groove 31, bare dice 1 that may or may not have a stack piece 2 can be located directly and precisely grabbed by sucker 4, so that the number of positioning steps are reduced; and 2. The present invention does not require multiple corresponding complicated positioning devices; tray 3 has a simple structure with no electronic components and is of low cost, which can effectively reduce the cost of the present invention.

When bare dice 1 is located in positioning groove 31, since the depth of positioning groove 31 is less than the height of bare dice 1, a portion of bare dice 1 is located in positioning groove 31 and its other portion, which has a complex geometric shape, is exposed outside positioning groove 31. So the present invention is suitable for both simple shaped bare dice and complex shaped bare dice.

What were disclosed above are only the specification and drawings of the present invention's preferred embodiments and it is therefore not intended that the present invention be limited to the particular embodiments disclosed. It shall be understood by those skilled in the art that various equivalent changes may be made depending on the specification and the drawings of the present invention without departing from the scope of the present invention.

What is claimed is:

1. A method for positioning bare dice, comprising:
   providing a bare dice;
   providing a tray with at least one positioning groove;
   placing the bare dice in the positioning groove, wherein a depth of the positioning groove is less than a height of the bare dice; and
   providing a sucker to directly grab the bare dice and then move the bare dice to a predetermined position on a corresponding circuit board;
   wherein a stack piece is misalignedly disposed on an upper face of the bare dice, one side of the stack piece and the bare dice being non-even thereby the upper face of the bare dice is partially exposed, and other side of the stack piece and the bare dice also being non-even and so that the other side of the stack piece extends out of the bare dice on the upper face of the bare dice.

2. The method as claimed in claim 1, wherein the exposed upper face of the bare dice defines a wire bond area.

3. The method as claimed in claim 2, wherein the stack piece is an insulator.

4. The method as claimed in claim 3, wherein the stack piece is a color filter.

5. The method as claimed in claim 1, wherein the bare dice is regarded as a first bare dice and the stack piece is regarded as a second bare dice.

6. The method as claimed in claim 1, wherein the distance between an inner wall of the positioning groove and the sides of the bare dice is 0.5 mm-1 mm.

7. A method for positioning bare dice, comprising:
providing a bare dice;
providing a tray with at least one positioning groove;
placing the bare dice in the positioning groove, wherein a depth of the positioning groove is less than a height of the bare dice; and
providing a sucker to directly grab the bare dice and then move the bare dice to a predetermined position on a corresponding circuit board;
wherein the distance between an inner wall of the positioning groove and the sides of the bare dice is 0.5 mm-1 mm.

* * * * *